United States Patent
Nair

(10) Patent No.: US 6,208,186 B1
(45) Date of Patent: Mar. 27, 2001

(54) DIFFERENTIAL SIGNAL GENERATOR

(75) Inventor: Rajendran Nair, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/392,909

(22) Filed: Sep. 9, 1999

(51) Int. Cl.[7] ............................................. H03K 3/12
(52) U.S. Cl. ............................. 327/199; 327/257; 327/415
(58) Field of Search .................................... 327/199, 239, 327/242, 245, 247, 249, 251, 253, 257, 258, 259, 295, 415, 416, 417

(56) References Cited

U.S. PATENT DOCUMENTS

| | | | |
|---|---|---|---|
| 4,644,185 | * | 2/1987 | Todd ..................................... 307/279 |
| 5,047,659 | * | 9/1991 | Ullrich ................................. 307/269 |
| 5,751,176 | * | 5/1998 | Sohn et al. ........................... 327/295 |
| 5,874,874 | * | 2/1999 | Hynes .................................. 327/259 |
| 5,909,134 | * | 6/1999 | Sohn et al. ........................... 327/295 |

* cited by examiner

*Primary Examiner*—Jeffrey Zweizig
(74) *Attorney, Agent, or Firm*—Schwegman, Lundberg, Woessner & Kluth, P.A.

(57) ABSTRACT

A differential signal generator accepts a single-ended signal on an input node and produces a differential signal on differential output nodes. The differential output nodes include a true output node and a complementary output node. In one embodiment, the differential signal generator includes a memory element coupled between the differential output nodes, a first switch that conditionally couples one of the differential output nodes to a reference node, and a second switch that conditionally couples the other differential output node to the same reference node. The memory element includes a latch having cross-coupled inverters. The cross-coupled inverters are each skewed to respond more quickly to one edge of an input signal. When the switches conditionally couple one of the differential output nodes to a ground node, the inverters are skewed to respond more quickly to falling edge input signals. When the switches conditionally couple one of the differential output nodes to a power node, the inverters are skewed to respond more quickly to rising edge input signals.

27 Claims, 5 Drawing Sheets

DIFFERENTIAL SIGNAL GENERATOR

FIELD

The present invention relates generally to digital circuits, and more specifically to circuits for generating differential signals from single-ended signals.

BACKGROUND

Integrated circuits can use single-ended signals as well as differential signals. Differential signals are signals that include two components: a true component and a complementary component. The two components of a differential signal have opposite polarities. For example, when the true component is a logical "1," the complementary component is a logical "0." Likewise, when the true component is a logical "0," the complementary component is a logical "1." In contrast to differential signals, single-ended signals are signals having a single component that takes on values of logical "1" and logical "0" with no complementary counterpart.

Differential signals can provide noise immunity and balanced currents that can aid in the operation of high speed circuits. Some circuits that utilize differential signals accept single-ended signals as inputs, and then generate time-aligned differential component signals for use in the circuit. If the two components of a differential signal are not time aligned, high speed operation of circuits can be adversely affected.

FIG. 1 shows a prior art differential signal generator. Differential signal generator 100 includes input node 102, true output node 108, and complementary output node 110. The complementary output is produced by inverter 106, and the true output is produced as a delayed version of the input. Delay 104 functions to compensate for the delay in inverter 106 in an attempt to time-align the differential component outputs. This approach can only time align the outputs within a certain time offset, in part because of manufacturing process variations and device-to-device mismatch between delay 104 and inverter 106. Differential signal generator 100 has a maximum operating frequency determined in part by the time offset between the true and complementary outputs.

For the reasons stated above, and for other reasons stated below which will become apparent to those skilled in the art upon reading and understanding the present specification, there is a need in the art for an alternate method and apparatus for generating differential signals from single-ended signals.

SUMMARY

In one embodiment, a method of generating a differential signal from a single ended signal includes receiving a signal transition on an input node and responsive to the signal transition, closing a first switch coupled to a first side of a latch to change a logical state of a first output node. The method also includes opening a second switch coupled to a second side of the latch.

In another embodiment, a differential signal generator includes a memory element having a true node and a complementary node, and a first switch responsive to a first control input, the first switch configured to conditionally couple the true node of the memory element to a first reference voltage. The differential signal generator further includes a second switch responsive to a second control input, the second switch configured to conditionally couple the complementary node of the memory element to the first reference voltage, and an input node coupled to the first control input and the second control input, such that when an input signal on the input node transitions from a first state to a second state, one of the first and second switches opens, and the other of the first and second switches closes.

In another embodiment, a differential signal generator include an input node, a true output node, and a complementary output node, and a memory element coupled between the true output node and the complementary output node. The differential signal generator further includes a voltage follower circuit having an input coupled to the input node and having an output node coupled to the true output node, and an inverter circuit having an input coupled to the input node and having an output node coupled to the complementary output node.

DESCRIPTION OF EMBODIMENTS

Figure 1:
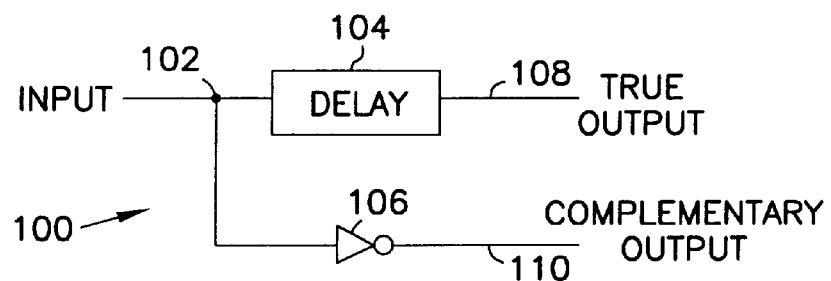
FIG. 1 is a prior art differential signal generator.

In the following detailed description of the embodiments, reference is made to the accompanying drawings which form a part hereof, and in which is shown by way of illustration specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. Moreover, it is to be understood that the various embodiments of the invention, although different, are not necessarily mutually exclusive. For example, a particular feature, structure, or characteristic described in one embodiment may be included within other embodiments. The following detailed description is, therefore, not to be taken in a limiting sense, and the scope of the present invention is defined only by the appended claims, along with the full scope of equivalents to which such claims are entitled.

Figure 2:
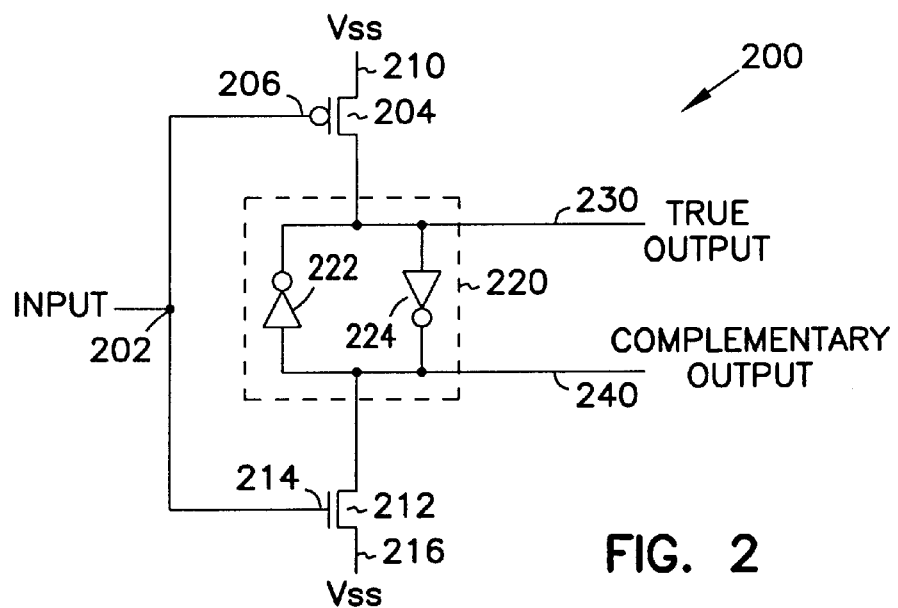
FIG. 2 is a differential signal generator according to one embodiment of the present invention.

FIG. 2 shows a differential signal generator in accordance with one embodiment of the present invention. Differential signal generator 200 receives an input signal on input node 202, and produces output signals on true output node 230 and complementary output node 240. Differential signal generator 200 includes switches 204 and 212, each coupling memory element 220 to a reference voltage labeled Vss in FIG. 2.

Switch 204 can be any type of switch capable of coupling reference node 210 to memory element 220 in response to a signal at control input 206. In the embodiment shown in FIG. 2, switch 204 is a P channel Field Effect Transistor (PFET), and control input 206 is a gate of the PFET. Likewise, switch 212 can be any type of switch capable of coupling reference node 216 to memory element 220 in response to a signal at control input 214. In the embodiment of FIG. 2, switch 212 is an N channel Field Effect Transistor (NFET), and control input 214 is a gate of the NFET. As used herein, the term PFET describes P channel field effect transistors, of which P channel Metal Oxide Semiconductor (PMOS) FETs are an example, and the term NFET describes N channel field effect transistors, of which N channel Metal Oxide Semiconductor (NMOS) FETs are an example.

Memory element 220 can be any type of memory element capable of producing signals on true output node 230 and complementary output node 240. In the embodiment of FIG. 2, memory element 220 is a latch including cross-coupled inverters 222 and 224. Cross-coupled inverters 222 and 224 save a logical state such that true output node 230 and complementary output node 240, when in steady-state, have opposite logical polarities.

In this description, signal polarities are discussed in terms of logical "1," logical "0," "high," and "low." The terms logical "1" and "high" are used synonymously, as are the terms logical "0" and "low." One skilled in the art will understand that a logical inversion can take place without departing from the scope of the present invention. For example, a signal representing a logical "1" can be low and a signal representing a logical "0" can be high while still practicing the present invention.

In operation, as a signal impressed on input node 202 changes from one logical state to another, a signal on true output node 230 follows the logical state of the input, and a signal on complementary output node 240 has the opposite logical state of the input. For example, when differential signal generator 200 is in steady-state with an input signal on input node 202 low, switch 204 is closed and true output node 230 is coupled to reference node 210. In the embodiment of FIG. 2, reference node 210 is at Vss, which is a logical "0." When switch 204 is closed by virtue of a low input signal on control input 206, switch 212 is open by virtue of the same low input signal on control input 214. With switch 212 open, reference node 216 is isolated from complementary output node 240. When true output node 230 is coupled to reference node 210, inverter 224 drives complementary output node 240 to a logical "1," and inverter 222 combines with inverter 224 to hold the latch in a steady-state.

When a signal on input node 202 transitions from a logical "0" to a logical "1," switch 204 opens and switch 212 closes. As a result, complementary output node 240 is coupled to reference node 216, and true output node 230 is isolated from reference node 210. The output drive of inverter 224 is overcome by the drive strength of reference node 216, and memory element 220 changes state. Complementary output node 240 is at a logical "0" by virtue of being coupled to reference voltage 216 through switch 212, and inverter 222 drives a logical "1" on to true output node 230. Inverter 224 combines with inverter 222 to latch the state of memory element 220.

Differential signal generator 200 includes a memory element with complementary outputs, with a switch coupled to each output, where the switch is capable of pulling the output to a logical "0." The opposite output is driven to a logical "1" by virtue of the complementary nature of memory element 220. In one embodiment, cross-coupled inverters 222 and 224 change from one logical state to another when a signal on an inverter input transitions through about one half of the power supply voltage. This results in a latch that responds equally to rising edge signals and falling edge signals. In another embodiment, cross-coupled inverters 222 and 224 respond faster to signals having falling edges that to signals having rising edges. This is described in more detail with reference to FIG. 3 below.

Figure 3:
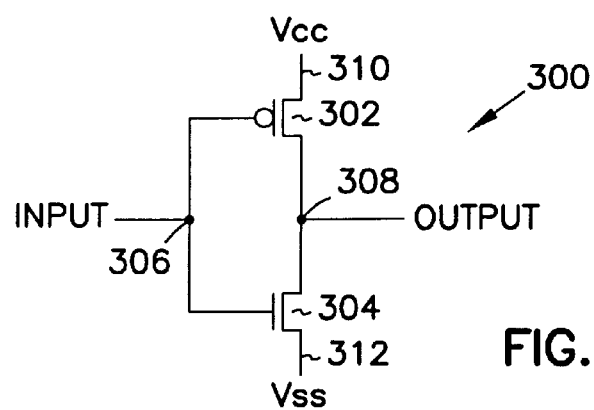
FIG. 3 is a skewed inverter according to one embodiment of the present invention.

FIG. 3 is a skewed inverter according to one embodiment of the present invention. Skewed inverter 300 includes PFET 302 and NFET 304. PFET 302 couples reference node 310 to output node 308 when a signal on input node 306 is low. NFET 304 couples reference node 312 to output node 308 when a signal on input node 306 is high. In the embodiment of FIG. 3, PFET 302 is sized to have a greater drive strength than NFET 304. As a result, skewed inverter 300 responds more quickly to falling edge signals than to rising edge signals on input node 306. In one embodiment, PFET 302 has a drive strength equal to substantially twice the drive strength of NFET 304. This corresponds to a size ratio between PFET 302 and NFET 304 of about 5:1, because a ratio of about 2.5:1 yields substantially equal drive strengths.

In another embodiment, skewed inverter 300 is skewed to respond faster to rising edge signals on input node 306. In this embodiment, NFET 304 is sized to have a greater drive strength than PFET 302. A ratio of PFET 302 drive strength to NFET 304 drive strength of about 0.5:1 can be achieved with a size ratio of PFET 302 to NFET 304 of about 1.25:1, because a size ratio of about 2.5:1 yields substantially equal drive strengths.

Referring now back to the embodiment of FIG. 2, inverter 222 and inverter 224 are skewed inverters having PFET drive strengths greater than NFET drive strengths. As a result, inverters 222 and 224 respond more quickly to falling edge input signals than to rising edge input signals. Memory element 220 changes state when the one of true output node 230 and complementary output node 240 transitions from high to low by virtue of being coupled to a reference node. The output node not being pulled low is driven high by one of inverters 222 and 224. When inverters 222 and 224 are skewed inverters in favor of falling edge input signals, the output transitioning from low to high transitions quickly in part because it is driven by a skewed inverter.

Figure 4:
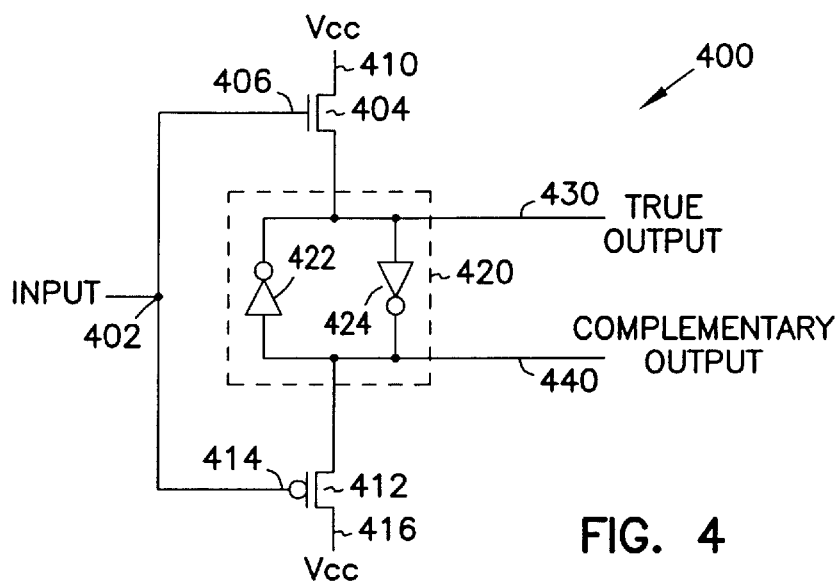
FIG. 4 is a differential signal generator according to another embodiment of the present invention.

FIG. 4 shows a complementary signal generator according to one embodiment of the present invention. Differential signal generator 400 includes memory element 420 which is conditionally coupled to reference nodes 410 and 416 as a result of a signal impressed on control inputs 406 and 414 of switch is 404 and 412 respectively. Reference nodes 410 and 416 are at Vcc, which corresponds to a logical "1." Memory element 420 is coupled between true output node 430 and complementary output node 440. True output node 430 is coupled to reference node 410 when switch 404 is closed. Switch 404 is closed when control input 406 has a high voltage impressed thereon. Complementary output node 440 is coupled to reference node 416 when switch 412 is closed. Switch 412 is closed when control input 414 has a low signal impressed thereon. Memory element 420 can be any memory element capable of producing complementary outputs. In the embodiment of FIG. 4, memory element 420 includes cross-coupled inverters 422 and 424.

The operation of differential signal generator 400 is analogous to the operation of differential signal generator 200 (FIG. 2). When input node 402 is in steady-state, one of switches 404 and 412 is open, and the other is closed. When a switch is closed, its corresponding output node is coupled to a reference node which holds the output node high. This is in contrast to differential signal generator 200 (FIG. 2) where one of the two outputs is pulled low.

In the embodiment of FIG. 4, inverters 422 and 424 are skewed inverters that are skewed to respond faster to rising edge input signals. This corresponds to skewed inverters 300 (FIG. 3) with NFET 304 sized to have greater drive strength than PFET 302. In one embodiment, inverters 422 and 424 are skewed such that the NFET drive strength is substantially twice that of the PFET drive strength.

Figure 5A:
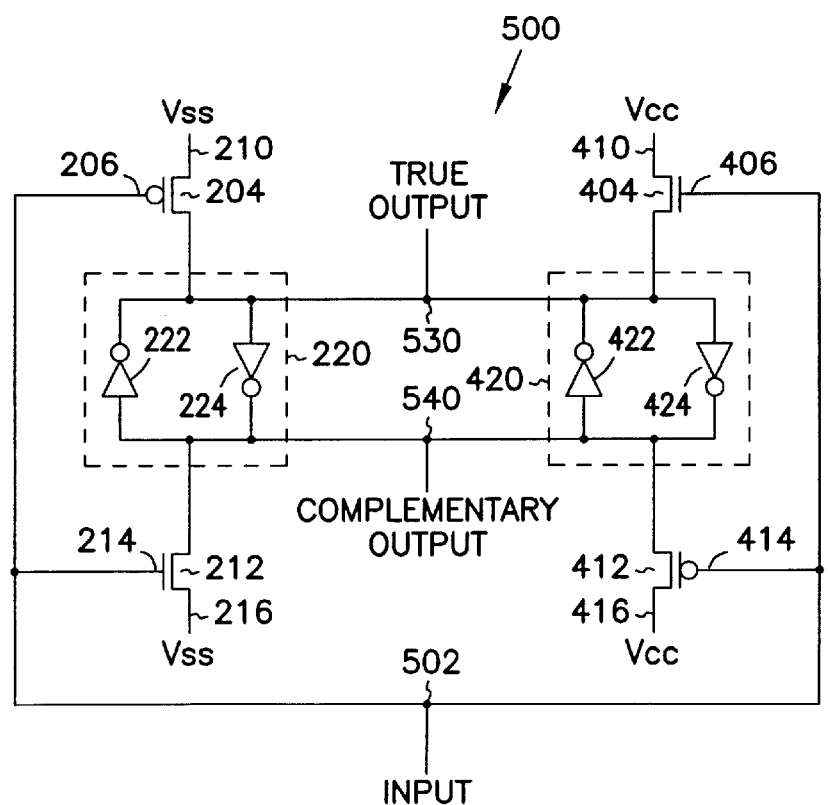
FIG. 5A is a differential signal generator according to another embodiment of the present invention.

FIG. 5A shows a differential signal generator in the accordance with one embodiment of the present invention. Differential signal generator 500 includes differential signal generator 200 (FIG. 2) and differential signal generator 400 (FIG. 4) in parallel. In operation, when input node has a steady-state signal impressed thereon, true output node 530 is coupled through a switch to a reference node, and complementary output node 540 is coupled through a switch to a reference node. At the same time, memory elements 220 and 420 retain the logical state of differential signal generator 500. For example, when input node 502 has a logical "0" impressed thereon, switch 204 is open and switch 404 is closed. As a result, true output node 530 is coupled to reference node 210. Also when input node 502 has a logical "0" impressed thereon, switch 412 is closed and switch 212 is open, and as a result, complementary output node 540 is coupled to reference node 416.

When a signal on input node 502 transitions from a logical "0" to a logical "1," switches 204 and 412 open, and switches 404 and 212 close. As a result, true output node 530 and complementary output node 540 both change logical state. Also during the transition, memory elements 220 and 420 change state. Cross-coupled inverters 222 and 224 are skewed to respond quickly to falling edge input signals. Likewise, cross-coupled inverters 422 and 424 are skewed to respond quickly to rising edge input signals.

Switches 204 and 404, when taken together, form a voltage follower. Likewise, switches 212 and 412, when taken together, form an inverter. Differential signal generator 500 can be viewed, therefore, as a voltage follower in parallel with and inverter thereby forming a circuit having differential outputs, and having a memory element disposed between the differential outputs. The memory element includes two latches, each having a pair of cross-coupled inverters. One pair of cross-coupled inverters, such as inverters 222 and 224, are skewed to respond quickly to falling edge input signals. The other pair of cross-coupled inverters, such as inverters 422 and 424, are skewed to respond quickly to rising edge input signals.

Figure 5B:
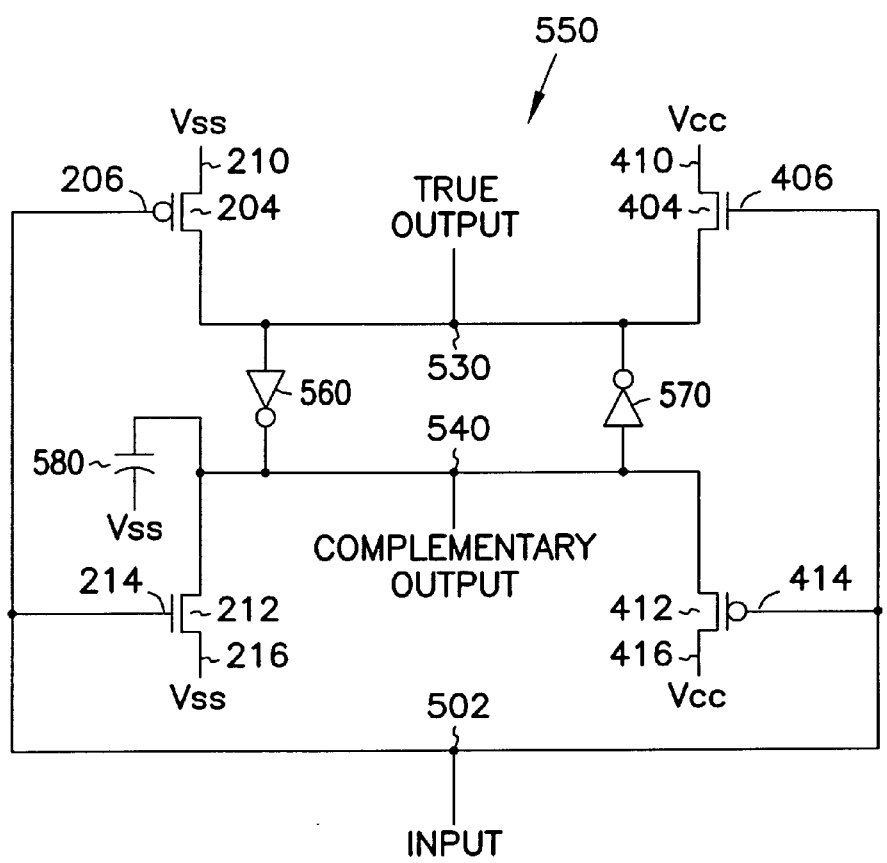
FIG. 5B is a differential signal generator according to another embodiment of the present invention.

FIG. 5B shows a differential signal generator in accordance with another embodiment of the present invention. The operation of differential signal generator 550 is analogous to the operation of differential signal generator 500 (FIG. 5A) in that inverters 560 and 570 form a memory element. When a signal impressed on input node 502 changes state, switches 204, 212, 404, and 412 also change state. In response to switches 204, 212, 404, and 412 changing state, the memory element changes state, and differential signals are generated on true output node 530 and complementary output node 540.

The memory element formed by inverters 560 and 570 is a latch. Inverters 560 and 570 can be skewed as described with reference to FIG. 3, or they can be inverters that are not skewed. Simulation results suggest that when inverters 560 and 570 are not skewed, the operation of differential signal generator 550 is substantially similar to differential signal generator 500 (FIG. 5A).

As previously described, switches 204 and 404 combine to form a voltage follower. When switch 204 is a PFET and switch is an NFET, the signal created on true output node 530 does not transition all the way to Vcc and to Vss by the action of the voltage follower alone. This is because a PFET will not pull the node all the way to Vss, and an NFET will not pull the node all the way to Vcc. Instead, the action of inverter 570 pulls true output node 530 all the way to Vcc and Vss. In contrast to a voltage follower, the inverter formed by switches 212 and 412 pulls complementary output node 540 all the way to Vcc and Vss. As a result, signal transitions on complementary output node 540 can be faster than signal transitions on true output node 530. In the embodiment of FIG. 5B, capacitor 580 slows the transition of a signal on complementary output node 540, thereby aiding in the time-alignment of true and complement signals generated by differential signal generator 550. Capacitor 580 can be implemented in many possible manners, including the addition of a grounded PFET.

Figure 6:
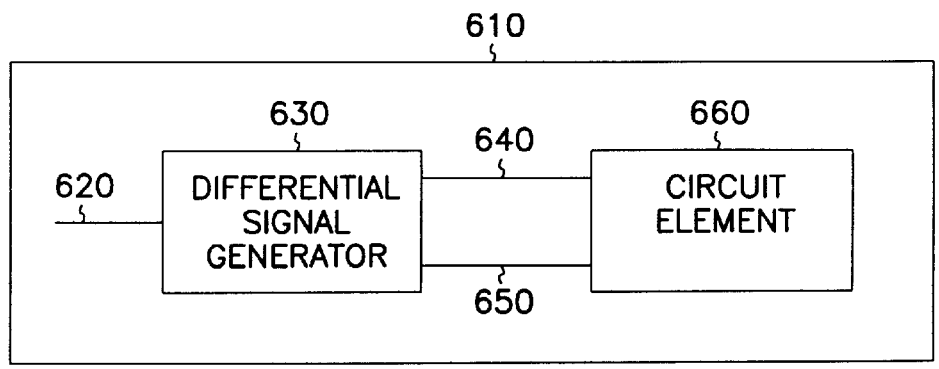
FIG. 6 is an integrated circuit according to one embodiment of the present invention.

FIG. 6 shows an integrated circuit according to one embodiment of the present invention. Integrated circuit 610 includes differential signal generator 630 and circuit element 660. Integrated circuit 610 can be any type of integrated circuit capable of including differential signal generator 630 and circuit element 660. In one embodiment, integrated circuit 610 is a processor such as a microprocessor, digital signal processor, or the like. In another embodiment, integrated circuit 610 is an application-specific integrated circuit (ASIC).

Differential signal generator 630 is a differential signal generator capable of accepting a single ended input signal on input node 620 and producing differential output signals on nodes 640 and 650. Differential signal generator 630 can be differential signal generator 200 (FIG. 2), differential signal generator 400 (FIG. 4), differential signal generator 500 (FIG. 5A), or differential signal generator 550 (FIG. 5B). Circuit element 660 is a circuit element configured to receive differential signals from a differential signal generator. Circuit element 660 can be a synchronous element, such as a flip flop or counter, or can be an asynchronous element such as a buffer or latch.

Figure 7:
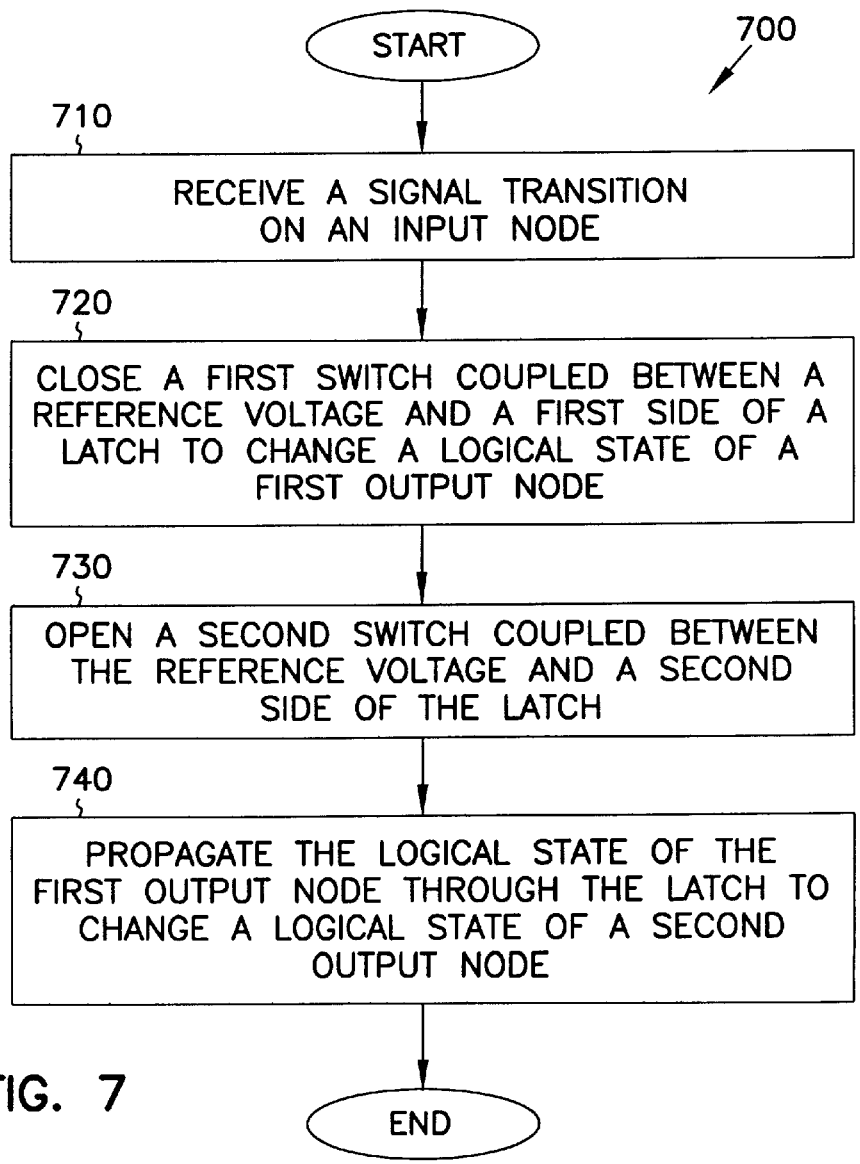
FIG. 7 is a flowchart of method for generating a differential signal according to one embodiment of the present invention.

FIG. 7 shows a flowchart of a method for generating a differential signal from a single-ended signal according to one embodiment of the present invention. Method 700 begins with action box 710, when a signal transition is received on an input node. In action box 720, a first switch coupled between a reference voltage and a first side of a latch is closed. Closing the first switch in action box 720 changes a logical state on a first output node. Actions taken in action box 720 can correspond to closing switch 204 (FIG. 2), thereby pulling true output node 230 low.

In action box 730, a second switch coupled between the reference voltage and a second side of the latch is opened. This can correspond to switch 212 opening and thereby decoupling complementary output node 240 from reference node 216. In action box 740, the logical state of the first output node is propagated through a latch to change a logical state of a second output node. This can correspond to the logical "0" on true output node 230 propagating through inverter 224, thereby driving complementary output node 240 high.

Figure 8:
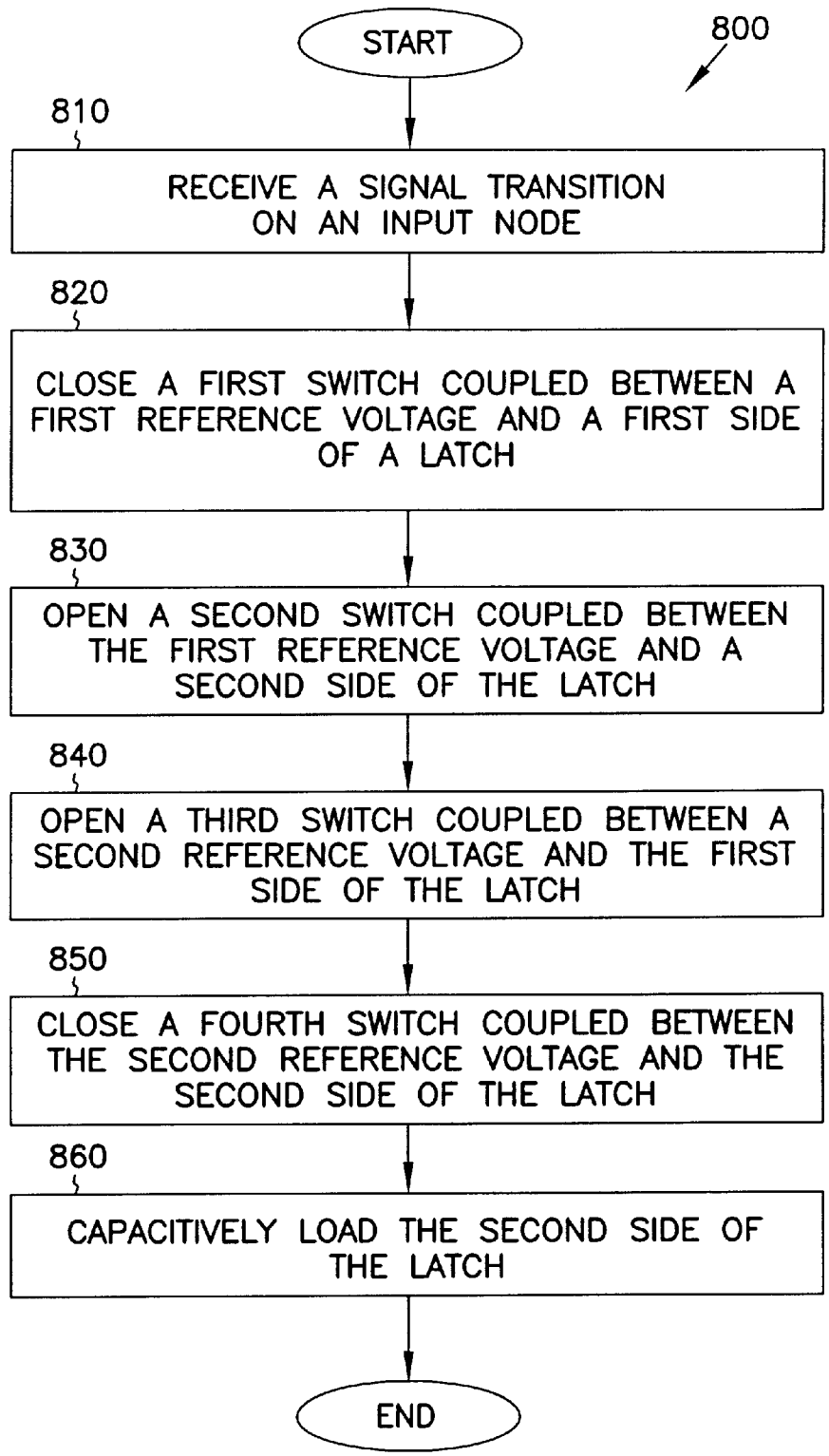
FIG. 8 is a flowchart of method for generating a differential signal according to another embodiment of the present invention.

FIG. 8 shows a flowchart of a method for generating a differential signal from a single-ended signal according to one embodiment of the present invention. Method 800 begins with action box 810 when a signal transition is received on an input node. In response to the signal transition of action box 810, a first switch is closed in action box 820. The first switch couples a first reference voltage to a first side of a latch.

In action box 830, a second switch is opened. The second switch is coupled between the first reference voltage and a second side of the latch. When the second switch is opened in action box 830, the second side of the latch is decoupled from the first reference voltage. In action box 840, a third switch is opened. The third switch is coupled between a second reference voltage and the first side of the latch. When the third switch is opened in action box 840, the first side of the latch is decoupled from the second reference voltage. In action box 850, a fourth switch is closed. The fourth switch couples the second reference voltage to the second side of the latch.

Referring now to FIG. 5B, the first switch can be switch 204, the second switch can be switch 212, the third switch can be switch 404, and the fourth switch can be switch 412 when a signal transitions low on input node 502. Method 800 is also applicable when a signal transitions high on input node 502. In this case, the first switch can be switch 404, the second switch can be switch 412, the third switch can be switch 204, and the fourth switch can be switch 212.

In action box 860, the second side of the latch is capacitively loaded. This slows a signal transition on the second side of the latch as a result of the switches changing state. The capacitive loading of action box 860 can be accomplished with a capacitor such as capacitor 580 as shown in FIG. 5B.

Method 800 results in complementary signals having transitions with opposite polarities. A signal on the first side of the latch transitions from the second reference voltage to the first reference voltage, and a signal on the second side of the latch transitions from the first reference voltage to the second reference voltage. The capacitive loading can function to time-align the complementary signals.

CONCLUSION

A differential signal generator includes a switches that can pull one of two differential output nodes to a reference voltage. A memory element is disposed between the two differential output nodes. In one embodiment the memory element is a latch including two cross-coupled inverters that have complementary transistors with differing drive strengths. Complementary transistors within inverters can be sized such that latches respond more quickly to either rising edge input signals or falling edge input signals. In another embodiment, a differential signal generator includes a memory element having two latches. One latch has cross-coupled inverters skewed to respond quickly to rising edge signals, and the other latch has cross-coupled inverters skewed to respond quickly to falling edge signals.

It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. A differential signal generator comprising:
   a memory element having a true node and a complementary node;
   a first switch responsive to a first control input, the first switch configured to conditionally couple the true node of the memory element to a first reference voltage;
   a second switch responsive to a second control input, the second switch configured to conditionally couple the complementary node of the memory element to the first reference voltage; and
   an input node coupled to the first control input and the second control input, such that when an input signal on the input node transitions from a first state to a second state, one of the first and second switches opens, and the other of the first and second switches closes;
   wherein the memory element comprises a latch having a pair of cross-coupled inverters, each of the pair of cross-coupled inverters including a PFET having a first drive strength, and an NFET having a second drive strength, wherein the first drive strength is not equal to the second drive strength.

2. The differential signal generator of claim 1 wherein the ratio of the first drive strength to the second drive strength is greater than about 2:1.

3. The differential signal generator of claim 1 wherein the ratio of the second drive strength to the first drive strength is greater than about 2:1.

4. A differential signal generator comprising:
   a memory element having a true node and a complementary node;
   a first switch responsive to a first control input, the first switch configured to conditionally couple the true node of the memory element to a first reference voltage;
   a second switch responsive to a second control input, the second switch configured to conditionally couple the complementary node of the memory element to the first reference voltage;
   an input node coupled to the first control input and the second control input, such that when an input signal on the input node transitions from a first state to a second state, one of the first and second switches opens, and the other of the first and second switches closes;
   a third switch responsive to a third control input, the third switch being configured to conditionally couple the true node to a second reference voltage, the third control input being coupled to the input node such that the third switch is closed when the second switch is closed; and
   a fourth switch responsive to a fourth control input, the fourth switch being configured to conditionally couple the complementary node to the second reference voltage, the fourth control input being coupled to the input node such that the fourth switch is closed when the first switch is closed;
   wherein the memory element comprises a first latch having a first pair of cross-coupled inverters, and a second latch having a second pair of cross-coupled inverters.

5. The differential signal generator of claim 4 wherein each of the first pair of cross-coupled inverters comprises:
   a PFET having a first drive strength; and
   an NFET having a second drive strength, wherein the first drive strength is not equal to the second drive strength.

6. The differential signal generator of claim 5 wherein each of the second pair of cross-coupled inverters comprises:

a PFET having a third drive strength; and an NFET having a fourth drive strength, wherein the third drive strength is not equal to the fourth drive strength.

7. The differential signal generator of claim 6 wherein the first drive strength is greater than the second drive strength and the fourth drive strength is greater than the third drive strength.

8. The differential signal generator of claim 7 wherein a ratio of the first drive strength to the second drive strength is greater than about 2:1 and a ratio of the fourth drive strength to the third drive strength is greater than about 2:1.

9. A differential signal generator comprising:

an input node, a true output node, and a complementary output node;

a memory element coupled between the true output node and the complementary output node, wherein the memory element comprises a first latch coupled between the true output node and the complementary output node, and a second latch coupled between the true output node and the complementary output node;

a voltage follower circuit having an input coupled to the input node, and having an output node coupled to the true output node; and an inverter circuit having an input coupled to the input node, and having an output node coupled to the complementary output node.

10. The differential signal generator of claim 9 wherein the first latch comprises a first pair of inverters, each of the first pair of inverters having a first pair of complementary semiconductor devices configured to respond fast to falling edge input signals.

11. The differential signal generator of claim 10 wherein the first pair of complementary semiconductor devices comprises:

a PFET having a first drive strength; and an NFET having a second drive strength, wherein the ratio of the first drive strength to the second drive strength is greater than 1:1.

12. The differential signal generator of claim 11 wherein the second latch comprises a second pair of inverters, each of the second pair of inverters having a second pair of complementary semiconductor devices configured to respond fast to rising edge input signals.

13. The differential signal generator of claim 12 wherein the second pair of complementary semiconductor devices comprises:

a PFET having a third drive strength; and an NFET having a fourth drive strength, wherein the ratio of the third drive strength to the fourth drive strength is less than 1:1.

14. The differential signal generator of claim 10 wherein the first pair of complementary semiconductor devices comprises:

a PFET having a first size; and an NFET having a second size, wherein the ratio of the first size to the second size is greater than 2.5:1.

15. The differential signal generator of claim 14 wherein the second latch comprises a second pair of inverters, each of the second pair of inverters having a second pair of complementary semiconductor devices configured to respond fast to rising edge input signals.

16. The differential signal generator of claim 15 wherein the second pair of complementary semiconductor devices comprises:

a PFET having a third size; and an NFET having a fourth size, wherein the ratio of the third size to the fourth size is less than 2.5:1.

17. An integrated circuit comprising:

a circuit element configured to receive a differential signal, the circuit element having a true input node and a complementary input node; and a differential signal generator comprising:

a memory element having a true node coupled to the true input node of the circuit element, and having a complementary node coupled to the complementary input node of the circuit element, the memory element including at least one inverter having a PFET with a first drive strength and an NFET with a second drive strength, wherein the first and second drive strengths are not equal;

a first switch responsive to a first control input, the first switch configured to conditionally couple the true node of the memory element to a first reference voltage;

a second switch responsive to a second control input, the second switch configured to conditionally couple the complementary node of the memory element to the first reference voltage; and an input node coupled to the first control input and the second control input, such that when an input signal on the input node transitions from a first state to a second state, one of the first and second switches opens, and the other of the first and second switches closes.

18. The integrated circuit of claim 17 wherein the memory element comprises a latch including at least one pair of cross-coupled inverters having complementary transistors with unequal drive strengths.

19. The integrated circuit of claim 17 wherein the memory element comprises two latches, each having a pair of cross-coupled inverters.

20. The integrated circuit of claim 19 wherein each inverter in the pair of cross-coupled inverters includes a PFET with a first drive strength and an NFET with a second drive strength, wherein the first and second drive strengths are not equal.

21. A processor comprising:

a circuit element configured to receive a differential signal, the circuit element having a true input node and a complementary input node; and a differential signal generator comprising:

an input node, a true output node coupled to the true input node of the circuit element, and a complementary output node coupled to the complementary input node of the circuit element;

a memory element coupled between the true output node and the complementary output node, the memory element including at least one inverter having a PFET with a first drive strength and an NFET with a second drive strength, wherein the first and second drive strengths are not equal;

a voltage follower circuit having an input coupled to the input node, and having an output node coupled to the true output node; and an inverter circuit having an input coupled to the input node, and having an output node coupled to the complementary output node.

22. The processor of claim 21 wherein the memory element comprises two latches, each latch including a pair of cross-coupled inverters.

23. The processor of claim 22 wherein each inverter includes complementary transistors with unequal drive strengths.

24. A method of generating a differential signal from a single ended signal, the method comprising:

receiving a signal transition on an input node;

responsive to the signal transition, closing a first switch coupled to a first side of a latch to change a logical state of a first output node; and responsive to the signal transition, opening a second switch coupled to a second side of the latch, wherein the latch comprises at least one pair of cross-coupled inverters having complementary transistors with unequal drive strengths.

25. The method of claim 24 further comprising propagating the logical state of the first output node through the latch to change a logical state of a second output node.

26. The method of claim 24 wherein the first switch is coupled between the first side of the latch and a first reference voltage, and the second switch is coupled between the second side of the latch and the first reference voltage.

27. The method of claim 26 further comprising:

responsive to the signal transition, opening a third switch coupled between the first side of the latch and a second reference voltage; and responsive to the signal transition, closing a fourth switch coupled between the second side of the latch and the second reference voltage to change a logical state of a second output node.

* * * * *